US006788535B2

(12) United States Patent
Dodgen et al.

(10) Patent No.: US 6,788,535 B2
(45) Date of Patent: Sep. 7, 2004

(54) OUTDOOR ELECTRONIC EQUIPMENT CABINET

(75) Inventors: Charles H. Dodgen, Cedar Park, TX (US); Sergio A. Alarcon, Austin, TX (US); Jerome A. Pratt, Georgetown, TX (US); Mark C. Woods, Pflugerville, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 34 days.

(21) Appl. No.: 10/317,317

(22) Filed: Dec. 12, 2002

(65) Prior Publication Data

US 2004/0114326 A1 Jun. 17, 2004

(51) Int. Cl.[7] .................................................. H05K 7/20
(52) U.S. Cl. ...................... 361/695; 62/259.2; 361/696; 361/831; 361/826; 361/735; 361/744; 165/80.3; 165/104.33; 165/104.34; 454/184; 379/328
(58) Field of Search .................... 62/259.2; 165/80.3, 165/104.33, 104.34; 361/688, 690, 694–696, 831, 826, 335, 736, 744; 379/328–332; 454/184

(56) References Cited

U.S. PATENT DOCUMENTS

| | | | |
|---|---|---|---|
| 3,210,456 A | * | 10/1965 | Skubal ...................... 174/16.1 |
| 4,535,386 A | | 8/1985 | Frey, Jr. et al. |
| 4,644,095 A | | 2/1987 | Bright et al. |
| 4,665,654 A | | 5/1987 | Stedron et al. |
| 5,150,277 A | | 9/1992 | Bainbridge et al. |
| 5,467,250 A | | 11/1995 | Howard et al. |
| 5,550,916 A | | 8/1996 | Daoud |
| 5,608,609 A | | 3/1997 | Morrell |
| 5,747,734 A | | 5/1998 | Kozlowski et al. |
| 5,765,743 A | * | 6/1998 | Sakiura et al. ............. 236/49.3 |
| 5,798,485 A | | 8/1998 | Rohde et al. |
| 5,802,168 A | | 9/1998 | Mantovani et al. |
| 5,806,948 A | | 9/1998 | Rowan, Sr. et al. |
| 5,832,988 A | * | 11/1998 | Mistry et al. ............... 165/103 |
| 5,949,646 A | * | 9/1999 | Lee et al. .................... 361/695 |
| 5,970,136 A | | 10/1999 | Mantovani et al. |
| 6,104,003 A | * | 8/2000 | Jones ......................... 219/400 |
| 6,330,152 B1 | * | 12/2001 | Vos et al. ................... 361/688 |
| 6,554,697 B1 | * | 4/2003 | Koplin ........................ 454/184 |
| 6,603,660 B1 | * | 8/2003 | Ehn et al. ................... 361/694 |
| 6,657,861 B2 | * | 12/2003 | Irmer ......................... 361/695 |

FOREIGN PATENT DOCUMENTS

| | | |
|---|---|---|
| AU | 199963081 A1 | 3/2000 |
| EP | 0849850 A1 | 10/1997 |
| EP | 1 026 932 A2 | 8/2000 |
| WO | WO 97/47167 | 12/1997 |
| WO | WO 98/10629 | 3/1998 |

* cited by examiner

*Primary Examiner*—Gregory D. Thompson
(74) *Attorney, Agent, or Firm*—James J. Trussell

(57) ABSTRACT

An outdoor telecommunications cabinet comprising an electronic compartment adapted to contain heat-generating electrical equipment, having a main electronic compartment including a rear wall panel and two clamshell doors, a floor panel and a cover panel, including access areas and an equipment storage area, the main compartment being adapted to contain heat-generating electrical equipment, at least one rack inside said main electronic compartment for electronic equipment, a base assembly supporting the said electronic compartment, having a width and depth similar to said main electronic compartment capable of being anchored to a base plate or pad, a ventilated sub-compartment in the base assembly containing an environmental cooling system, a pair of clamshell doors, movable between an open position permitting access to both front and back sides of said electrical equipment and a closed position in which the doors maintain a substantially closed environment in the electronic compartment, a cable entry port, typically on the rear wall panel, and a return air duct assembly mounted to said rear panel to form an enclosed duct vertically traversing the length of the electronic compartment and interfacing with a cutout area on the floor panel for circulating airflow through an enclosed path to the electronic compartment.

19 Claims, 7 Drawing Sheets

OUTDOOR ELECTRONIC EQUIPMENT CABINET

FIELD OF THE INVENTION

The present invention relates to an outdoor telecommunications cabinet adapted for housing electronic equipment and providing environmental control for such electronic equipment without increasing the "footprint" dimensions of the cabinet.

BACKGROUND OF THE INVENTION

Modern telecommunications architectures utilize outdoor cabinets to house sensitive electronic equipment installed within a few miles of the subscriber base. These cabinets historically provided protection from the elements for passive cross-connect modules where service could be connected or disconnected, and additional service subscribers were added. As telecommunications and data communications have evolved, the cabinets also began to provide a temperature regulated operating environment for heat-generating electronic equipment, which is generally sized to fit on industry standard racks. The cabinets may be installed on telephone poles or on concrete pads.

One example of a conventional outdoor electrical equipment cabinet is disclosed in U.S. Pat. No. 4,535,386 (Frey, Jr. et al.). This cabinet employs a heat exchanger to dissipate internally generated heat. The heat exchanger exchanges heat between the air in the cabinet and the ambient air outside the cabinet, without allowing the interior and ambient air to mix. In this way, a substantially closed or sealed environment can be maintained within the cabinet, while still allowing for adequate heat dissipation. The heat exchanger is located in the main portion of the cabinet, in proximity to the electronics requiring cooling. However, the presence of the heat exchanger in the cabinet can interfere with the cables used to interconnect the various electronic components, making the routing of these cables somewhat more difficult. Also, since the heat exchanger occupies a significant amount of space, the cabinet must usually be made larger to accommodate it.

U.S. Pat. No. 5,467,250 (Howard et al.) discloses an electrical equipment cabinet that employs a door-mounted heat exchanger so that the heat exchanger does not occupy internal space required for the electrical equipment while maintaining a closed or sealed environment within the cabinet. An arrangement of ducts and vents is used to force interior and exterior air through channels in the heat exchanger using powered fans mounted within the main portion of the cabinet. The mounting of the heat exchanger on or within the door of the cabinet makes more efficient use of the space available within the cabinet.

However, heat exchangers installed in doors also increase the size of the exterior of the cabinet, and may include weighty equipment which adds to the difficulty of opening and closing the door for maintenance work, and may even cause warping of the door over time, rendering it difficult or impossible to properly close and latch. For equipment with high temperature regulation requirements, a door assembly may not be feasible due to the excess weight placed on the door panel. Further, the thickness and weight added to the door by the heat exchanger assembly may require that the base assembly be made larger in order to balance the door/exchanger assembly. In many existing cabinet installations, there is no space for any additional cabinet "footprint". Heat exchangers in doors require opening the equipment compartment to maintain the exchanger, which may not be desirable. Finally, in cabinets with clamshell doors, there is a center opening, and the individual portions of the door that create the front panel will not be of adequate size to mount the heat exchanger unit.

As telecommunications equipment continues to evolve, new cabinets may be installed close to older passive equipment-containing cabinets to upgrade the type or quality of service available to the local subscriber. In high density housing areas, the cabinets may be installed against building walls and interface with multiple housing units via conduits through the wall. Ongoing challenges include the ability to provide the craft monitoring and addition/disconnection service with full access to both the front and rear of the equipment chassis, while cooling the electronic equipment effectively, interfacing with existing passive equipment and cabinets containing such equipment effectively, interfacing with wiring rooms for large buildings effectively, and accomplishing these tasks while minimizing cabinet size and obtrusiveness in residential and business housing areas and landscaping.

It has now been discovered that new small cabinets designed to handle electronic equipment can be mounted on or near multiple unit users such as apartment buildings or hotels to provide upgraded service without installation in a main wiring room. The cabinet can be installed adjacent to a wall, with minimal intrusiveness or requirement for pad space. The cabinet has an environmental unit installed in a base assembly sub-compartment and does not add to the size of the cabinet footprint, or the weight of the access doors. The base assembly is normally used solely for support or for minor functions, and can now be used to house the environmental control system, i.e., the cooling system without an increase in size of the cabinet.

It has also been discovered that one or two new cabinets can flank an existing passive cross-connect cabinet and be attached to the existing cabinet to house both electronics equipment with a rack and utility electrical interfaces, cooling systems and battery back-up power therefore. This provides the necessary infrastructure for enhanced services such as xDSL on a limited number of subscriber lines within the existing passive cross-connect cabinet.

SUMMARY OF THE INVENTION

The invention provides an outdoor telecommunications (telecom) cabinet suitable for pad-mounting or pole-mounting containing one or more "single" electronic equipment racks.

Specifically, the invention provides an outdoor telecommunications cabinet comprising a) a main electronic compartment including a rear wall panel and two clamshell doors, a floor panel and a cover panel, said compartment including access areas and an equipment storage area, said main compartment adapted to contain heat-generating electrical equipment, b) at least one rack inside said main electronic compartment for electronic equipment, c) a base assembly supporting said main electronic compartment, having a width and depth similar to said main electronic compartment capable of being anchored to a base plate or pad, d) a ventilated sub-compartment in said base assembly containing an environmental cooling system, e) a pair of clamshell doors, said doors being movable between an open position permitting access to both front and back sides of said electrical equipment and a closed position in which it maintains a substantially closed environment in the electronic compartment, f) cable entry ports on said rear wall panel, g) a return air duct assembly mounted to said rear panel to form an enclosed duct vertically traversing the electronic compartment and interfacing with a cutout area on said floor panel for circulating airflow through an enclosed path to said electronic compartment from said sub-compartment, said environmental control system for effective dissipation of waste heat, said cabinet being capable of pole-mounting or pad-mounting, or mounting adjacent to a wall to access multiple subscribers.

The invention further provides an outdoor equipment cabinet provided with a single electronic equipment shelf and an access area and a cabinet footprint with dimensions similar to the equipment shelf dimensions plus the access area.

Cabinets of the invention have the environmental control system within a sub-compartment of the base assembly such that access to the electronic components is not affected by the presence of such environmental control system, nor is access to the electronic components necessary to service the environmental control system.

The outdoor electronic equipment cabinet of the invention provides an environmental control system with a totally enclosed duct system.

In one aspect of the invention, an outdoor cabinet for electronic equipment is provided wherein the environmental control system is an air conditioning unit.

In another aspect of the invention, an outdoor cabinet for electronic equipment is provided wherein the environmental control system is a heat exchanger.

The invention further provides a cabinet array, in which the first cabinet is a standard cabinet containing passive telecommunications equipment and a second cabinet is attached to one side panel wherein the second cabinet includes:

a) a main electronic compartment including a rear wall panel and two clamshell doors, a floor panel and a cover panel, said compartment including access areas and an equipment storage area, said main compartment adapted to contain heat-generating electrical equipment, b) at least one rack inside said main electronic compartment for electronic equipment, c) a base assembly supporting the main electronic compartment, having dimensions similar to the main electronic compartment capable of being anchored to a base plate or pad, d) a ventilated sub-compartment in said base assembly containing an environmental cooling system, e) a pair of clamshell doors, said doors being movable between an open position permitting access to both front and back sides of said electrical equipment and a closed position in which the doors maintain a substantially closed environment in the electronic compartment, f) cable entry ports on the rear wall panel, g) a return air duct assembly mounted to the rear panel to form an enclosed duct vertically traversing the electronic compartment and interfacing with a cutout area on the floor panel for circulating airflow through an enclosed path to the electronic compartment from said sub-compartment, the environmental control system providing effective dissipation of waste heat.

Cabinets of the invention may be pad mounted or fitted with adapter brackets and pole mounted. The invention further provides an outdoor cabinet that mounts directly against a building wall to service multiple subscriber buildings.

As used herein, the following terms have these meanings:

1. The terms "pad-mounted", "pad-mountable" and the like mean that a cabinet may be attached to a concrete pad which is poured onto the ground.
2. The terms "pole-mounted", "pole-mountable" and the like mean that a cabinet may be attached to a telephone pole.
3. The term "telecom" is short for the word telecommunications.
4. The term "footprint" means the area defined by the base of the cabinet.
5. The term "environmental control system" means a system for controlling the temperature and/or humidity within the electronic compartment.
6. The term "array" means a set of more than one cabinet that is physically adjacent or attached together.
7. The term "the craft" refers to telecom technical maintenance personnel.

DETAILED DESCRIPTION OF THE INVENTION

Figure 1:
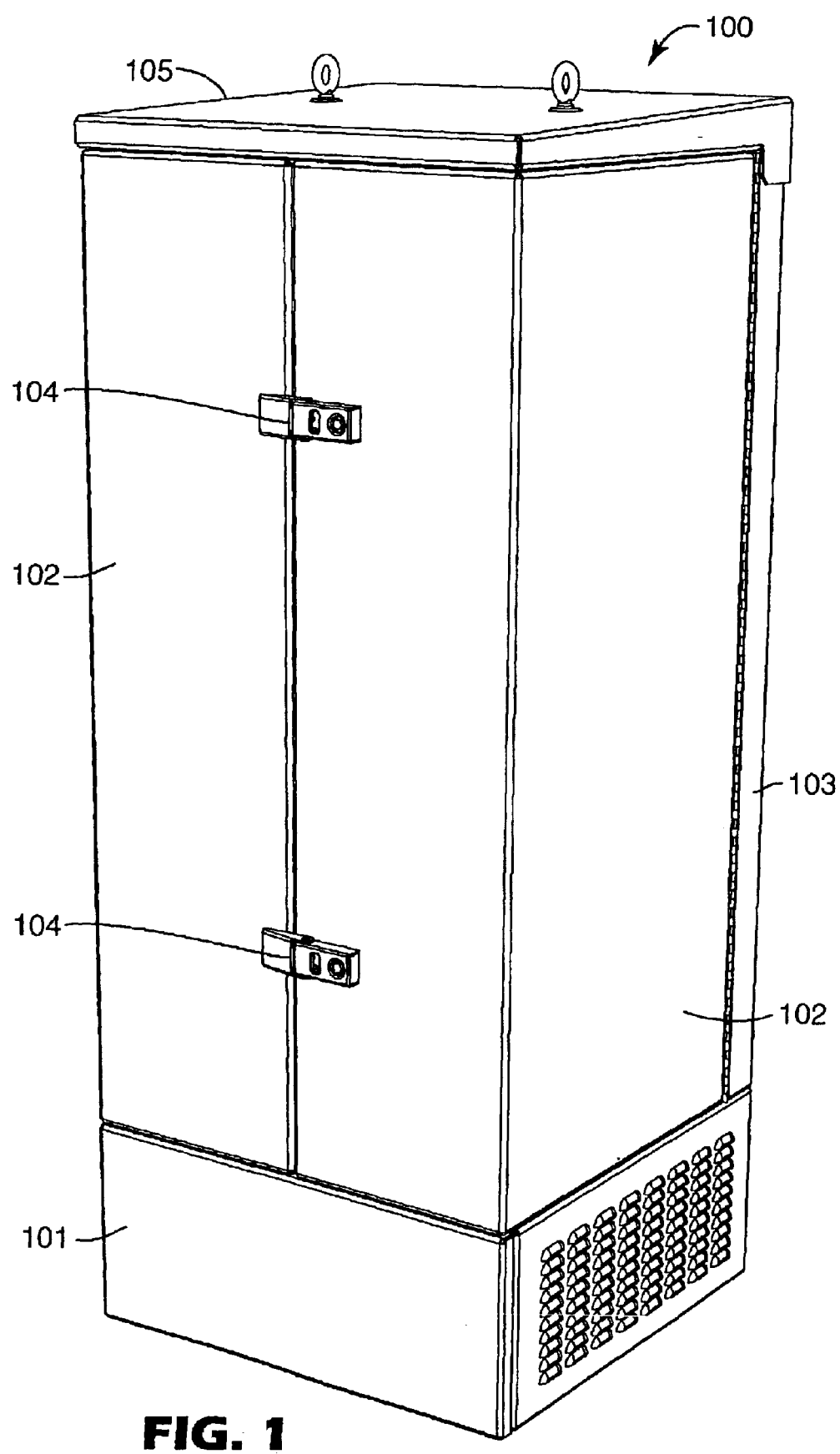
FIG. 1 is a perspective view of the external appearance of the cabinet with doors closed and latched.

In FIG. 1, the invention provides an outdoor cabinet 100 having a base assembly 101 which supports the weight of the cabinet and is anchored to a concrete pad (not shown), or a metal support plate if pole-mounted (also not shown). Clamshell type doors 102 are hinged onto a removable rear flat panel assembly 103 and have tensioned latches 104, which hold the doors closed. A sloped cover 105 acts as a solar shield and rain guard. The rear flat panel assembly 103 will seal against a wall or against the end of an existing, passive equipment-containing, cross-connect cabinet by means of a foam gasket material (not shown). The rear flat panel assembly 103 is secured from inside the cabinet. No attachment hardware is accessible from outside, reducing the possibility of vandalism.

Figure 2:
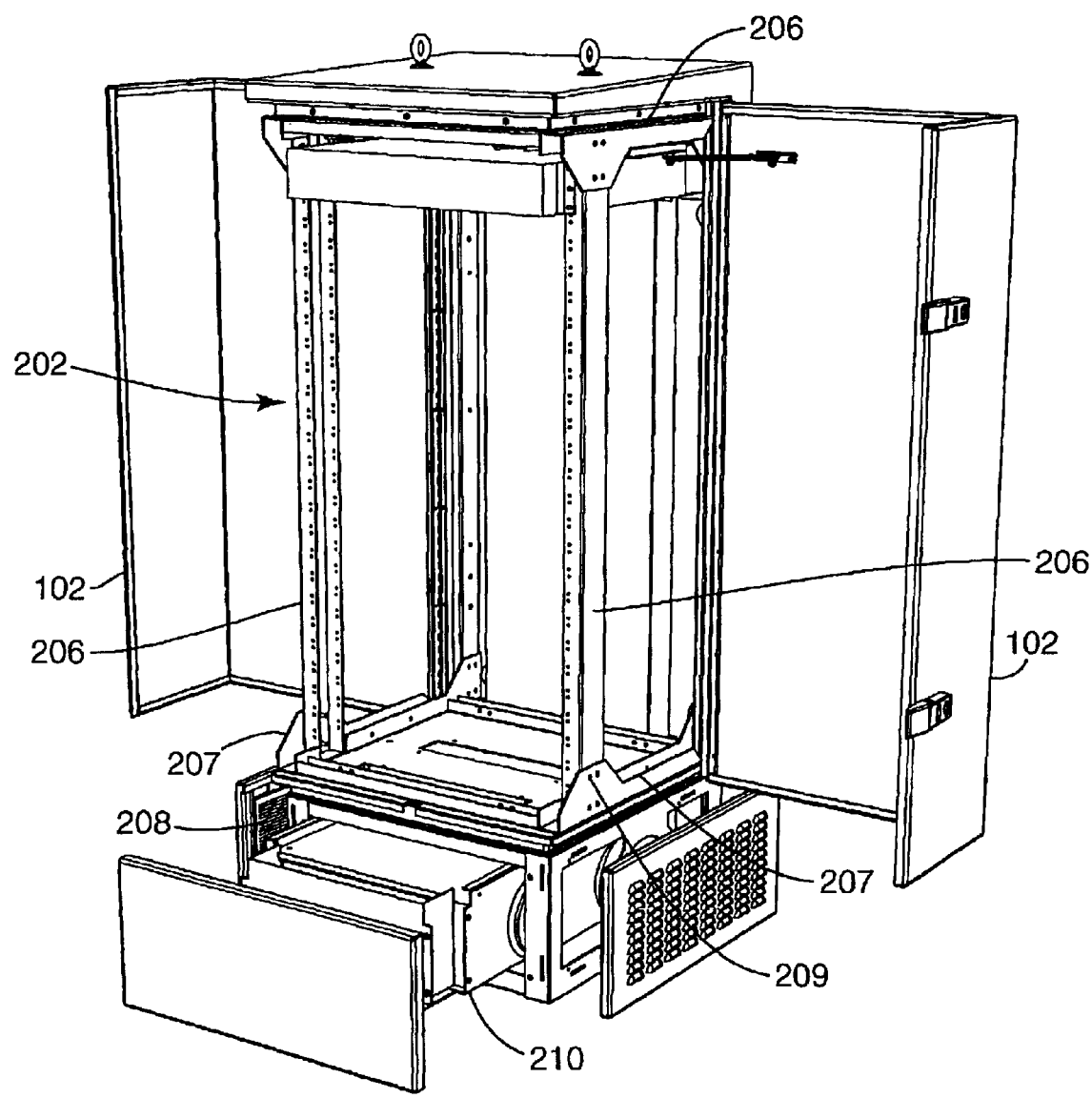
FIG. 2 is a perspective view of the cabinet with doors fully open.

With the doors 102 fully open, as shown in FIG. 2, the cabinet's electronic compartment 202 and the racks 206, both front and back, are accessible by the craft while the cabinet occupies a minimum footprint size. The clamshell doors 102 require a space of 22 inches (55.9 cm) on either side of the cabinet to open a full ninety degrees (90°).

Horizontal structural members 207 are attached to the rack members 206 using threaded studs 209 to form the front of the internal frame of the cabinet. The sub-compartment 208 slides out for easy access to the environmental cooling system 210.

Figure 3:
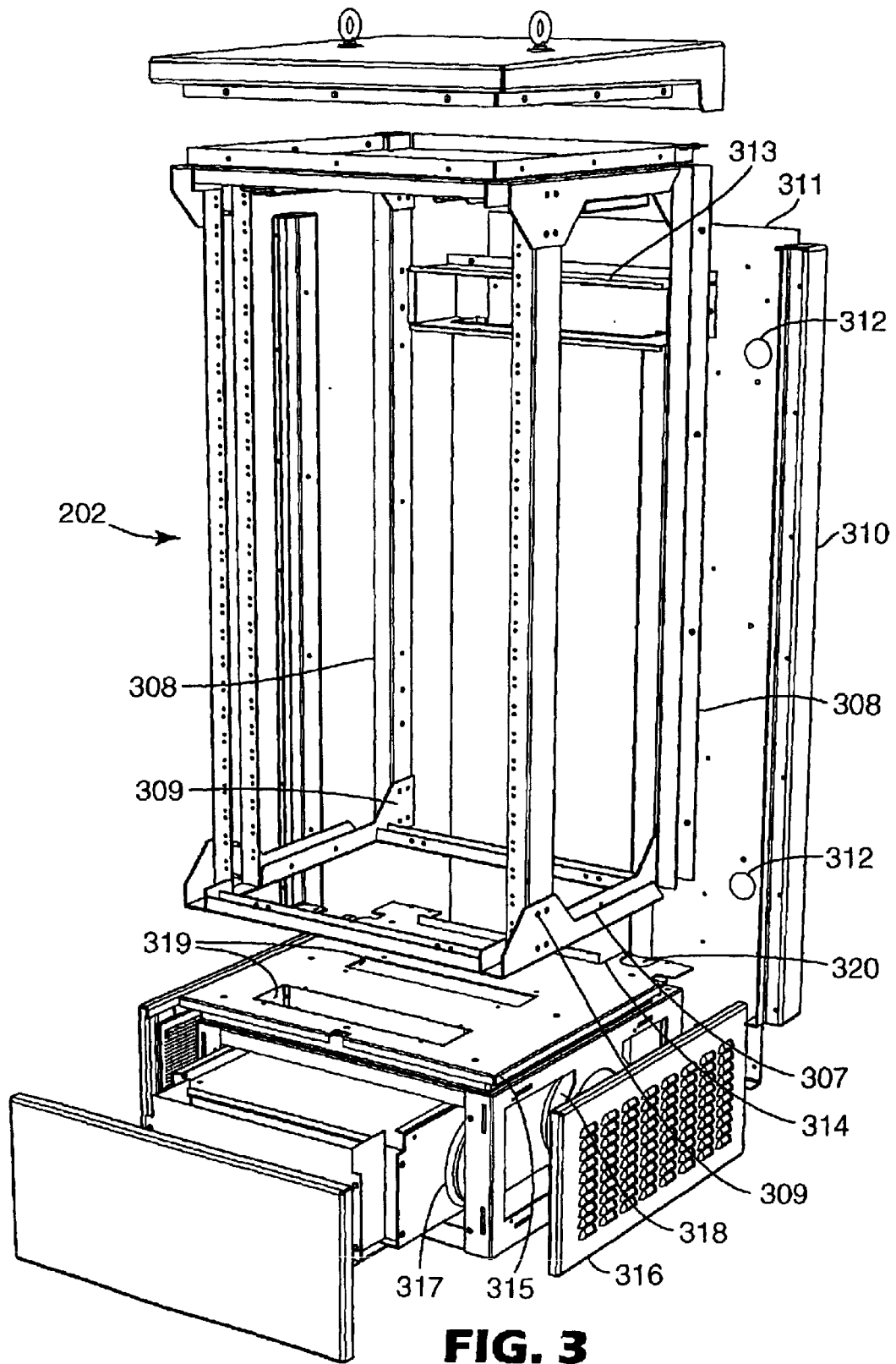
FIG. 3 is an exploded view of the interior portion of the cabinet and the sub-compartment with an installed heat exchanger.

FIG. 3 shows the attachment of rear vertical channels 308 to the structural members 307 and 309 in order to complete the internal structure frame for the main electronic compartment 202. Rear corner panels 310 are also attached to the frame to provide a mount for the rear flat panel 311 which contains cable ports 312 for ingress/egress of electrical and telephone cabling. Return air duct assembly 313 is mounted to rear panel 311 to form an enclosed duct, which traverses the vertical length of the main electronic compartment 202. The duct 313 interfaces with the cutout 314 in the cabinet floor panel 315 to complete an enclosed path leading to the sub-compartment 208 (see FIG. 2) in base assembly 101 (see FIG. 1). The environmental cooling system 210 (see FIG. 2) supplies cooled air, which is directed upward through at least one slot 319, (slots are positioned according to the specific system installed, i.e., air conditioner or heat exchanger) in the cabinet floor panel 315, and into the electronic equipment compartment 202. Heated air from the electronic compartment 202 is returned to the sub-compartment 208 for cooling. The cabinet floor panel 315 also contains a cable port 320 for entry of a fiber-optic cable feed through the base. A louvered side panel 316 provides means for maintaining the temperature of the sub-compartment 208. A heat exchanger blower venturi 317 faces the side panel 316 and the blower 318 is partially visible adjacent the inner side of the louvered side panel 316.

Figure 4:
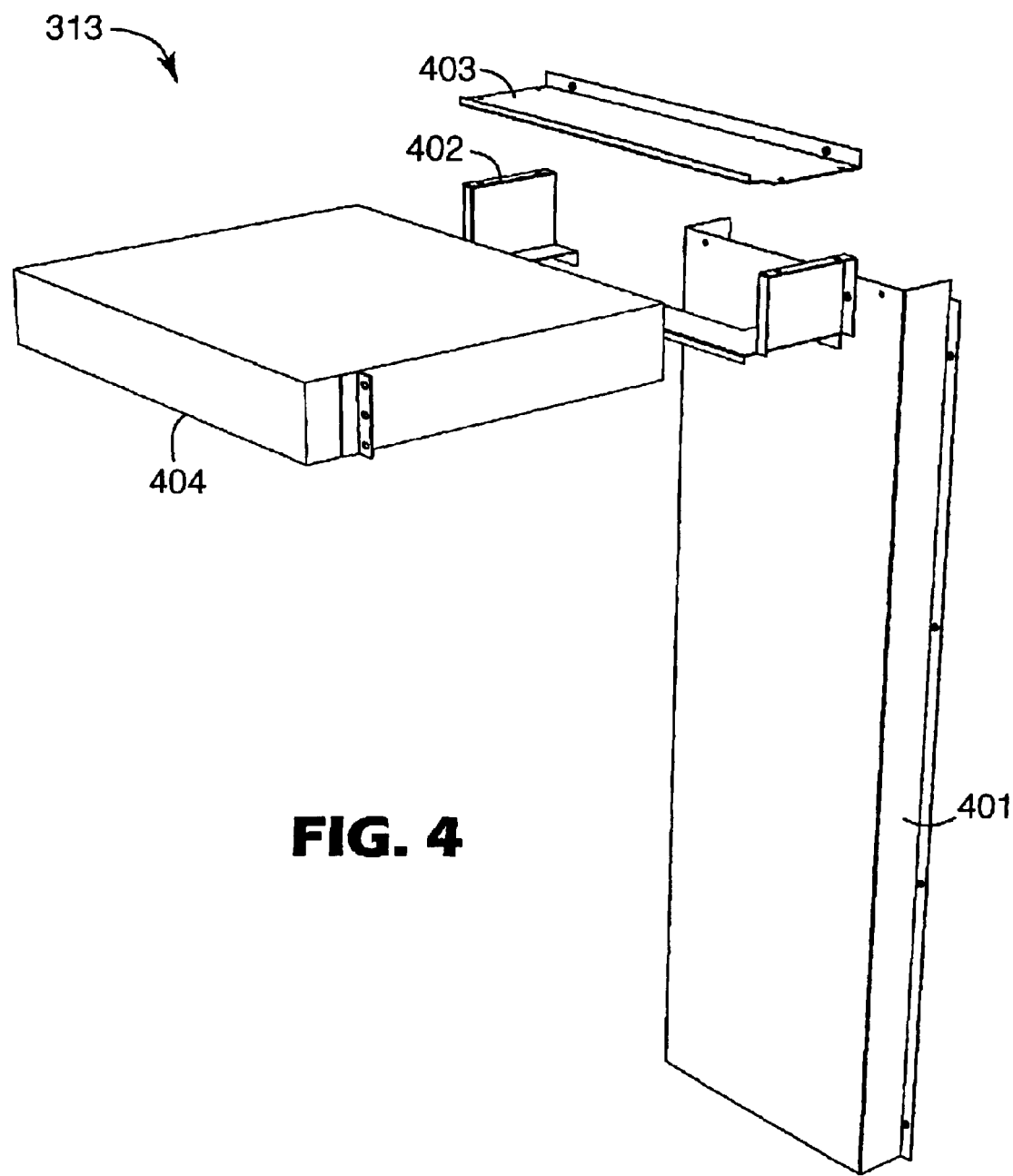
FIG. 4 is an exploded view of the return air duct assembly.

FIG. 4 is an exploded view of the rear duct assembly 313 showing the duct itself 401, the plenum 402, and the air discharge grill 403 having a cover 404. Cooled air created by the environmental cooling system 210 in the sub-compartment 208 (see FIG. 2) is forced through the vertical duct 401 through the plenum 402 and into the air discharge grill 403, which is located in the rear of the electronic equipment compartment 202 (see FIG. 2). The cooled air is then discharged into the electronic equipment compartment 202 to provide relief from the elevated temperature due to the operation of the electronic equipment.

Figure 5:
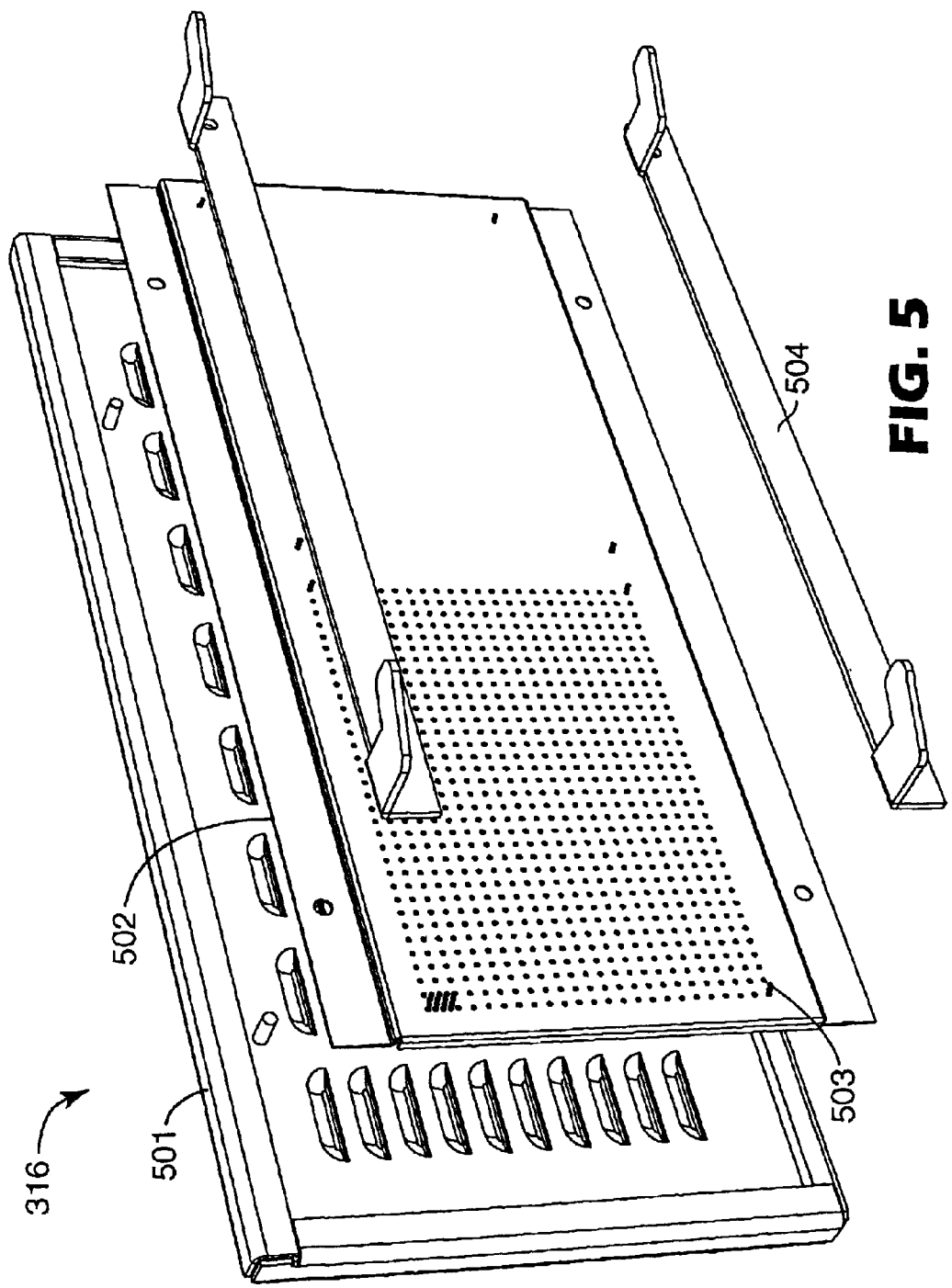
FIG. 5 is an exploded view of a side panel assembly.

FIG. 5 is an exploded view of one embodiment of a side access panel 316 for the base assembly 101. The outer louvered panel 501 is formed from aluminum and contains from about 60 to about 120 louvers, preferably about 80 louvers of similar size, arranged in similar rows and columns. This embodiment of the outer louvered panel 501 shows 80 louvers in 10 equal columns of 8 louvers. Inside and adjacent to the louvered panel is the vent screen 502, which has a pattern of holes 503, and is fastened to the louvered panel and the assembly by means of the two panel brackets 504.

Figure 6:
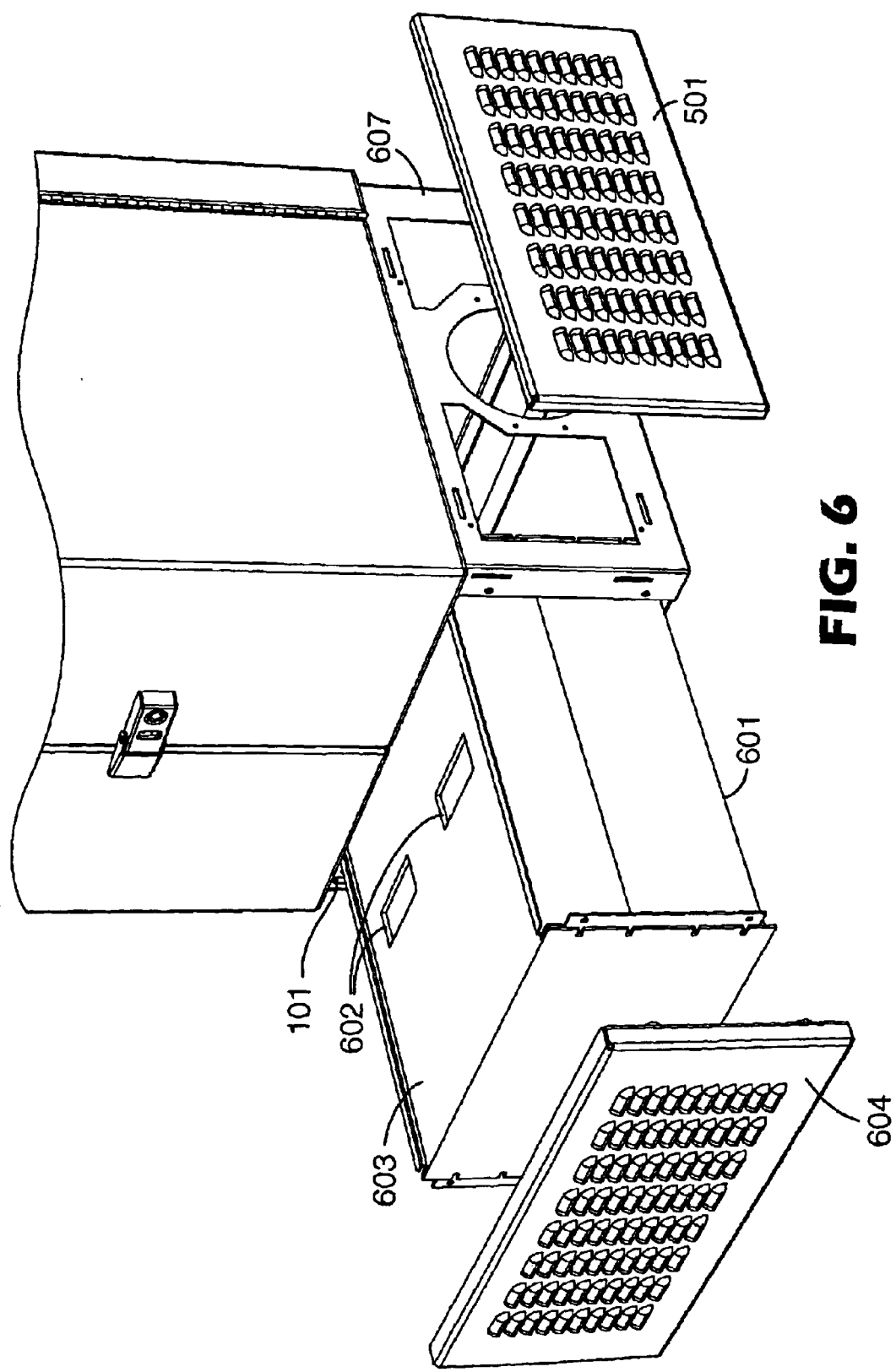
FIG. 6 is an exploded view of the base assembly and sub-compartment with an installed air conditioner.

FIG. 6 is a base assembly 101 wherein the environmental cooling system includes an installed air conditioner 601, in this case, a Kooltronic® H9 Series air conditioner. The air conditioner unit 601 is placed within the sub-compartment and side louvered access panels 501 along with the inner vent screen 502 (see FIG. 5), to help maintain the temperature in the sub-compartment. The skirt kit for the outdoor cabinet may also provide a front louvered panel 604. Slots 602 for air exit to the main electronic compartment 202 are visible in the air conditioner cover plate 603. The louvered panels are attached by any conventional attachment means such as screws, rivets, etc., but preferably an easily removable attachment means to the air conditioner front attachment plates, which also serve to attach the air conditioner to the sub-compartment structural frame 607. The air conditioner unit 601 slides out for easy maintenance access.

Figure 7A:
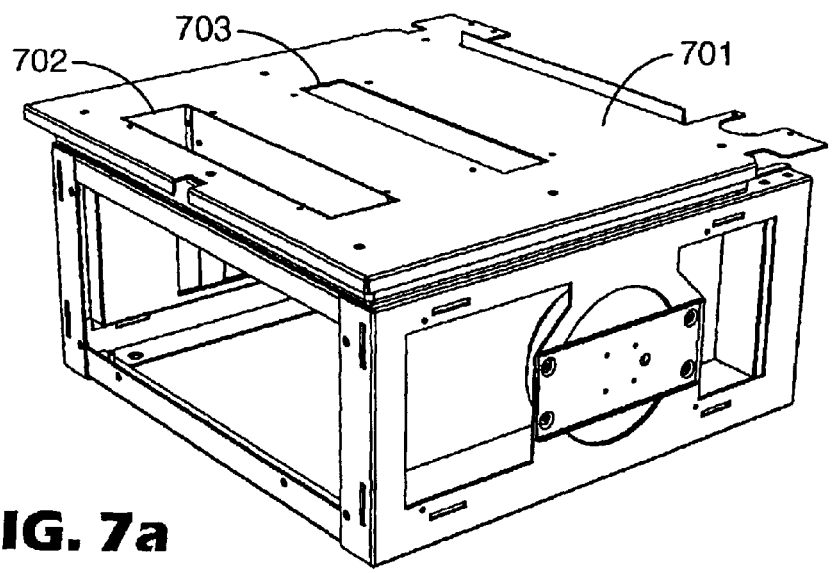
FIG. 7 is an exploded view of the sub-compartment in the base assembly configured for a heat exchanger.
Figure 7B:
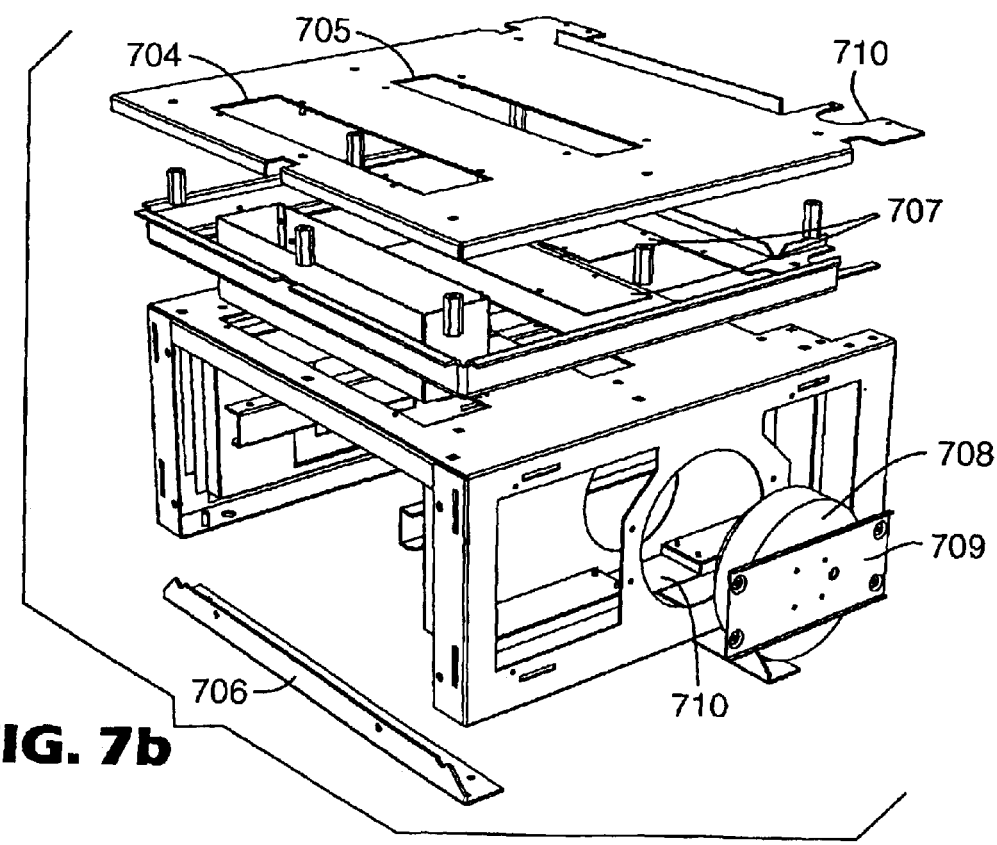

FIG. 7a is a perspective view and FIG. 7b is an exploded view of a framework 700 for a base assembly 101 configured to hold a heat exchanger, such as an air-to-air cross flow heat exchanger, which is easily installed/removed by removing the front structural frame element 706. The heat exchanger cover plate 701 for the environmental cooling system 210 (see FIG. 2) contains a slot 702 for air return from the electronic equipment compartment 202 (see FIG. 2) and a slot 703 where cool air exits to the main electronic equipment compartment 202 (see FIG. 2). Under slot 702, the cool air duct 704 that provides the cool air from the environmental cooling system 210 (see FIG. 2) can be seen, and the return air adapter plate 705, as well as blanking plates 707, can be removed if additional slots for ducts or air exchange are needed. The assembly contains a blower 708 and has an opening for a blower venturi 709. The cover plate of this cabinet also has a cable port 710 for entry of a fiber optic cable.

In a special application, an electronics cabinet of the invention may be attached to and flanked by a traditional passive telecommunications cabinet. The flat panel assembly will seal against a wall against the end of an existing passive-cross-connect-equipment-containing cabinet by means of a foam gasket material.

The preceding description of the outdoor electronic equipment cabinet is illustrative and should not be construed to be limiting. The scope and spirit of the invention is solely that defined by the claims.

What is claimed is:

1. An outdoor telecommunications cabinet comprising
a main electronic compartment including a rear flat wall panel and two clamshell doors, and a floor panel and a cover panel, said compartment including access areas and an equipment storage area, said main compartment adapted to contain heat-generating electrical equipment,
at least one rack inside said main electronic compartment for electronic equipment,
a base assembly supporting said main electronic compartment, having dimensions similar to said main electronic compartment capable of being anchored to a base plate or pad,
a ventilated sub-compartment in said base assembly containing an environmental cooling system,
said clamshell doors being movable between an open position permitting access to both sides of said electrical equipment and a closed position in which the doors maintain a substantially closed environment in the electronic compartment,
a return air duct assembly mounted to said rear flat wall panel to form an enclosed duct vertically traversing the electronic compartment and interfacing with a cutout area on said floor panel for circulating airflow through an enclosed path to said electronic compartment from said sub-compartment, said environmental cooling system providing effective dissipation of waste heat.

2. An outdoor telecommunications cabinet according to claim 1 wherein said environmental cooling system is an air conditioner.

3. An outdoor telecommunications cabinet according to claim 1 wherein said environmental cooling system is a heat exchanger.

4. An outdoor telecommunication cabinet according to claim 1 wherein the ventilated sub-compartment comprises a front panel, a rear panel including an opening for a duct, and two removable louvered side access panels.

5. An outdoor telecommunications cabinet according to claim 4 wherein the front panel and rear panel also comprise louvers.

6. An outdoor telecommunications cabinet according to claim 1 wherein the floor panel of the main compartment also functions as a top panel for the sub-compartment.

7. An outdoor telecommunications cabinet according to claim 6 wherein said floor panel includes at least one opening for supplying air to the electronics compartment.

8. An outdoor telecommunications cabinet according to claim 7 wherein said opening is a slot.

9. An outdoor telecommunications cabinet according to claim 1 wherein cable entry ports are located on said rear panel.

10. An outdoor telecommunications cabinet according to claim 9 wherein said cut-out area is a slot.

11. An outdoor telecommunications cabinet according to claim 4 wherein said floor panel also includes a cable port.

12. An outdoor telecommunications cabinet according to claim 1 wherein said clamshell doors include tensioned latches.

13. An outdoor telecommunications cabinet according to claim 1 wherein said cabinet is adapted for installation against a wall and said cabinet further comprises multiple conduits for makings connections through said wall.

14. An outdoor telecommunications cabinet array comprising a first outdoor telecommunications cabinet containing passive telecommunications equipment having first and second side panels, said cabinet having a second telecommunications cabinet attached to said first side panel of said first cabinet, said second cabinet comprising:

a main electronic compartment including a rear wall panel and two clamshell doors, a floor panel and a cover panel, said compartment including access areas and an equipment storage area, said main compartment adapted to contain heat-generating electrical equipment, and at least one rack inside said main electronic compartment for electric equipment, a base assembly supporting said main electronic compartment, having dimensions similar to said main electric compartment capable of being anchored to a base plate or pad, a ventilated sub-compartment in said base assembly containing an environmental cooling system, said clamshell doors being movable between an open position permitting access to both front and back sides of said electrical equipment and a closed position in which the doors maintain a substantially closed environment in the electric compartment, cable entry ports, a return air duct assembly mounted to said rear panel to form an enclosed duct vertically traversing the electronic compartment and interfacing with a cutout area on said floor panel for circulating airflow through an enclosed path to said electronic compartment from said sub-compartment, said environmental cooling system providing effective dissipation of waste heat.

15. An outdoor telecommunications cabinet array according to claim 14 wherein said environmental cooling system in said second cabinet is an air conditioner.

16. An outdoor telecommunications cabinet array according to claim 14 wherein said environmental cooling system in said second cabinet is a heat exchanger.

17. An outdoor telecommunications cabinet array according to claim 14 wherein the second electronic equipment compartment holds only a single electronic equipment rack.

18. An outdoor telecommunications cabinet array according to claim 14 wherein the ventilated sub-compartment comprises a front panel, a rear panel including an opening for a duct, and two removable louvered side access panels.

19. An outdoor telecommunications cabinet array according to claim 14 further comprising a third telecommunications cabinet, said third cabinet being attached to said second side panel of said first cabinet, said third cabinet comprising:

a main electronic compartment including a rear wall panel and two clamshell doors, a floor panel and a cover panel, said compartment including access areas and an equipment storage area, said main compartment adapted to contain heat-generating electrical equipment, at least one rack inside said main electronic compartment for electronic equipment, a base assembly supporting said electronic compartment, having dimensions similar to said main electronic compartment capable of being anchored to a base plate or pad, a ventilated sub-compartment in said base assembly containing an environmental cooling system, said clamshell doors being movable between an open position permitting access to both front and back sides of said electrical equipment and a closed position in which the doors maintain a substantially closed environment in the electronic compartment, cable entry ports on said wall panel, a return air duct assembly mounted to said rear panel to form an enclosed duct vertically transversing the electronic compartment and interfacing with a cutout area on said floor panel for circulating airflow through an enclosed path to said electronic compartment from said sub-compartment, said environmental cooling system providing dissipation of waste heat.

* * * * *

UNITED STATES PATENT AND TRADEMARK OFFICE
CERTIFICATE OF CORRECTION

PATENT NO. : 6,788,535 B2
DATED : September 7, 2004
INVENTOR(S) : Dodgen, Charles H.

It is certified that error appears in the above-identified patent and that said Letters Patent is hereby corrected as shown below:

Column 6,
Line 66, delete "telecommunication" and insert -- telecommunications -- therefore.

Column 7,
Line 27, delete "makings" and insert -- making -- therefor.
Lines 40, 43 and 52, delete "electric" and insert -- electronic -- therefor.

Column 8,
Line 33, delete "said electronic" and insert -- said main electronic -- therefor.
Line 45, delete "said wall" and insert -- said rear wall -- therefor.
Line 47, delete "transversing" and insert -- traversing -- therefor.

Signed and Sealed this

Nineteenth Day of April, 2005

JON W. DUDAS
*Director of the United States Patent and Trademark Office*